United States Patent [19]
Avinash

[11] Patent Number: 5,923,789
[45] Date of Patent: Jul. 13, 1999

[54] BAND LIMITED INTERPOLATION AND PROJECTION OF SPATIAL 3-D IMAGES

[75] Inventor: Gopal B. Avinash, New Berlin, Wis.

[73] Assignee: General Electric Company, Milwaukee, Wis.

[21] Appl. No.: 08/691,200

[22] Filed: Aug. 7, 1996

[51] Int. Cl.[6] .................................................... G06K 9/36
[52] U.S. Cl. ........................ 382/276; 382/250; 382/300
[58] Field of Search .................................. 382/128, 129, 382/130, 299, 300, 298, 250, 276

[56] References Cited

U.S. PATENT DOCUMENTS

| | | | |
|---|---|---|---|
| 5,297,550 | 3/1994 | Margosian | 382/6 |
| 5,297,551 | 3/1994 | Margosian et al. | 382/6 |
| 5,368,033 | 11/1994 | Moshfeghi | 128/653.2 |
| 5,485,533 | 1/1996 | Hatano et al. | 382/56 |
| 5,644,646 | 7/1997 | Du et al. | 382/108 |
| 5,647,024 | 7/1997 | Kawauchi et al. | 382/232 |

OTHER PUBLICATIONS

Are the Corners of k–space Worth Preserving?, *SMR 95*, p. 734, M.A.Bernstein, GE Med. Sys., Milwaukee, WI.

Reduction of Partial Volume Artifacts by Averaging Voxel Shifted Images, *ISMRM*, p. 39, S. Kurucay & P. Schmalbrock, Dept. of Radi., The Ohio St. Univ., Columbus OH.

Reduction of Partial–Volume Artifacts with Zero–filled Interpolation in Three–dimensional MR Angiography, *JMRI Sep/Oct. 1994*, pp. 733–741, Yiping, et al.

Improved Magnetic Resonance Angiography Vessel Edge Definition with Truncated Sinc Interpolation, *ISMRM 96*, p. 1609, Cooper, et al.

*Proceedings of the International Society for Magnetic Resonance in Medicine,* 4th Scientific Meeting and Exhibition, vol. 3, Apr. 1996, New York, New York.

*Primary Examiner*—Christopher S. Kelley
*Assistant Examiner*—Sheela Chawan
*Attorney, Agent, or Firm*—Barry E. Sammons; Christian G. Cabou; Phyllis Y. Price

[57] ABSTRACT

A bandlimited 3D image data set is interpolated before being projected onto a 2D image plane to improve image resolution. The 3D MRA image data set is divided into subvolumes which are separately interpolated and projected onto the 2D image plane. Interpolation is accomplished using a discrete cosine transformation ("DCT"), zero-filling to extend the transformed subvolume and inverse transforming the zero-filled subvolume.

7 Claims, 3 Drawing Sheets

BAND LIMITED INTERPOLATION AND PROJECTION OF SPATIAL 3-D IMAGES

BACKGROUND OF THE INVENTION

The field of the invention is imaging methods and systems. More particularly, the invention relates to a method for improving the resolution of projected images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described with reference to the well known Fourier transform (FT) imaging technique. This technique is discussed, for example in an article entitled "Spin Warp NMR Imaging and Applications to Human Whole-Body Imaging" by W. A. Edelstein et al., *Physics in Medicine and Biology,* Vol. 25, pp. 751–756 (1980). It employs a variable amplitude phase encoding magnetic field gradient pulse prior to the acquisition of NMR spin-echo or gradient-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan and the NMR signal is sampled in the presence of the readout gradient $G_x$ to produce a set of NMR data from which an entire image can be reconstructed. The acquired two-dimensional array of "k-space" NMR data is Fourier transformed to produce a corresponding image. The same method can be expanded to produce three-dimensional images by stepping a third gradient ($G_z$) through a sequence of phase encoding values during the scan.

The resolution of the reconstructed image is determined in large part by the number of signal samples acquired during the scan. For example, if the phase encoding gradient is stepped through 256 levels and if 256 samples of each NMR signal are acquired during the scan the resulting k-space NMR data array will contain 256 by 256 data elements. When this is Fourier transformed, an image array containing 256 by 256 pixels is reconstructed. On the other hand, if the number of phase encodings is reduced to 128, the resolution of the resulting 128 by 256 pixel image is reduced along one axis. Since it requires more scan time to acquire more samples, most clinical scans are a compromise between the need for a higher resolution image and the need for a reduced scan time.

Magnetic resonance angiography ("MRA") uses the nuclear magnetic resonance phenomenon to produce images of the human vasculature. Two basic techniques have been proposed and evaluated. The first class, time-of-flight (TOF) techniques, consists of methods which use the motion of the blood relative to the surrounding tissue. The most common approach is to exploit the differences in signal saturation that exist between flowing blood and stationary tissue. Flowing blood, which is moving through the excited section, is continually refreshed by spins experiencing fewer excitation pulses and is, therefore, less saturated. The result is the desired image contrast between the high-signal blood and the low-signal stationary tissues.

MRA methods have also been developed that encode motion into the phase of the acquired signal as disclosed in U.S. Pat. No. Re. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase or complex difference between the pair of velocity-encoded images.

Despite the tremendous strides made in recent years, at many clinical sites MRA is still considered a research tool and is not routinely used in clinical practice. More widespread application of either TOF or PC techniques is hampered by the presence of a variety of deleterious image artifacts, which can mask and, in some cases, even mimic pathology. One of these deleterious effects is lack of clear vessel edge definition, particularly with small vessels. Compromised edge definition may be due to partial volume averaging or due to the position of the vessel edge relative to the reconstructed array of voxels.

There are two methods used to improve MRA vessel edge definition when increased sampling is not an available option to increase resolution. The first technique is to reposition the image reconstruction grid so that the vessel edge lies entirely within a reconstructed voxel. This is easily accomplished by imparting a uniform phase shift to all of the acquired k-space data. The difficulty with this solution is that it may improve the definition of some vessel edges and reduce the definition of others.

The second technique is to interpolate the reconstructed image data to a finer grid spacing. Linear interpolation and cubic spline interpolation can be used, for example, to improve image quality, but such real-space interpolation techniques do not increase the resolution of the image.

Another method which is used to improve image resolution is referred to in the art as "zero-filled interpolation" or "sinc interpolation" or "band-limited interpolation". As described by Y. P. Du et al, "Reduction of Partial-Volume Artifacts with Zero-Filled Interpolation in Three-Dimensional MR Angiography," *JMRI* 1994; 4:733–741, zero-filled interpolation is usually implemented by appending zeros on each dimension of the k-space data before it is Fourier transformed. In 3D MR angiography, for example, zeros are appended on each dimension of k-space in all three spatial frequency directions. The much enlarged array of k-space data is then inverse Fourier transformed to produce a corresponding enlarged image data array. The field of view is not changed in this enlarged image array, but the number of pixels required to depict a particular structure is increased. Substantial improvement in vessel continuity and visibility, especially in small vessels, is achieved using this method.

Zero-filled interpolation is difficult to implement in commercially available MRI systems. The k-space data set is increased in size by a factor of two or more along each of its dimensions. For a 3D angiographic data set, this means an increase in the k-space data storage and the image storage by a factor of eight or more. This makes it more costly and difficult to archive, network and display. In addition, the increased k-space data array requires much more time to Fourier transform with existing array processor hardware.

Yet another approach described by T. O. Cooper et al "Improved Magnetic Resonance Angiography Vessel Edge Definition With Truncated Sinc Interpolation" *ISMRM* Proceedings, Vol. 3, April/May 1996. A truncated sinc function is proposed for interpolation in the spatial domain. To keep the computational burden within reason, this method compromises interpolation accuracy.

SUMMARY OF THE INVENTION

The present invention is a method for improving the quality of images, and particularly, the quality of images produced from bandlimited data acquired by medical imaging equipment such as MRI and CT systems. The improvement in image quality is spectacular when applied to MRA images produced by projecting 3D image data onto a 2D projection image plane. More specifically, the method includes dividing a region of interest in a reconstructed image array into a plurality of subvolumes; interpolating each subvolume by: transforming the image data in the subvolume; zero-filling the transformed subvolume; and inverse transforming the zero-filled subvolume to produce an interpolated subvolume; and combining the interpolated subvolumes to form an interpolated image.

A general objective of the invention is to improve image resolution. Image resolution is improved by an interpolation method that is accurate and does not require excessive processing time, excessive memory or unusual hardware. Processing time is reduced by using a transformation approach to interpolation, and both memory and processing time are reduced by dividing and interpolating the image data as smaller subvolumes. Interpolating subvolumes is facilitated by using a cosine transformation which is not periodic in nature like the more common Fourier transformation and which does not require complex numbers.

Another objective of the invention is to improve MRA images produced by projection of 3D image data. Rather than projecting the entire interpolated 3D data set, each interpolated subvolume can be projected separately. The separate projected, interpolated subvolumes are then combined to form the final interpolated image.

Yet another object of the invention is to provide a real-time method for magnifying selected portions of images produced by projecting 3D image data. A region in the projection image is selected by the operator and a corresponding portion of the 3D image data is selected. The selected 3D image data is magnified by transforming it, zero filling and inverse transforming it. The magnified 3D image data is then projected to produce a magnified image of the selected region.

DESCRIPTION OF THE PREFERRED EMBODIMENT

While the present invention is applicable to improve the quality of images produced from a set of bandlimited data acquired with any modality, in the presently preferred embodiment the modality used is a magnetic resonance imaging system.

Figure 1:
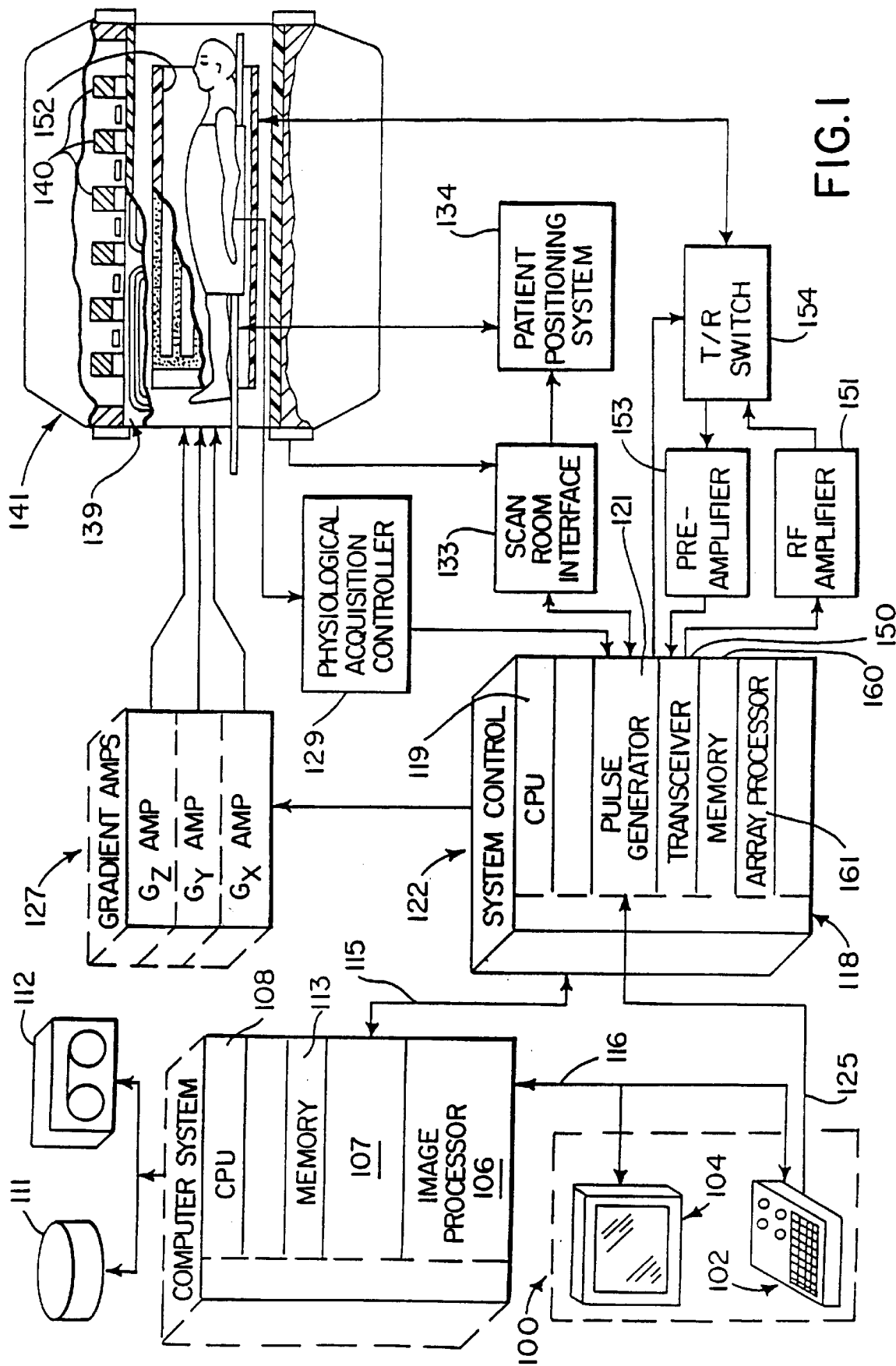
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/ receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

While the present invention may be employed to improve any image produced by the MRI system of FIG. 1, it is particularly useful for 2D projection images produced from a 3D MRA image array. Such an MRA data set is illustrated at 200 in FIG. 3. Although the MRA data array 200 may be acquired using a number of different pulse sequences, in the preferred embodiment a fast 3D rf phase spoiled gradient recalled echo pulse sequence is employed. The pulse sequence "3dfgre" available on the General Electric 1.5 Tesla MR scanner sold under the trademark "SIGNA" with revision level 5.5 system software is used. The size of the 3D MRA data array 200 will differ depending on the particular examination being performed, but in the preferred embodiment it is x=256 by y=256 by z=60. In a conventional MRA procedure, this 3D MRA image array 200 is projected onto a 2D image array having a resolution, for example, of 256 by 256 pixels. The angle of this projection is selected by the operator. As will now be described, the present invention enables one to produce a 2D projection image having a resolution, for example, of 1024 by 1024 pixels from this same 3D image array 200.

Figure 3:
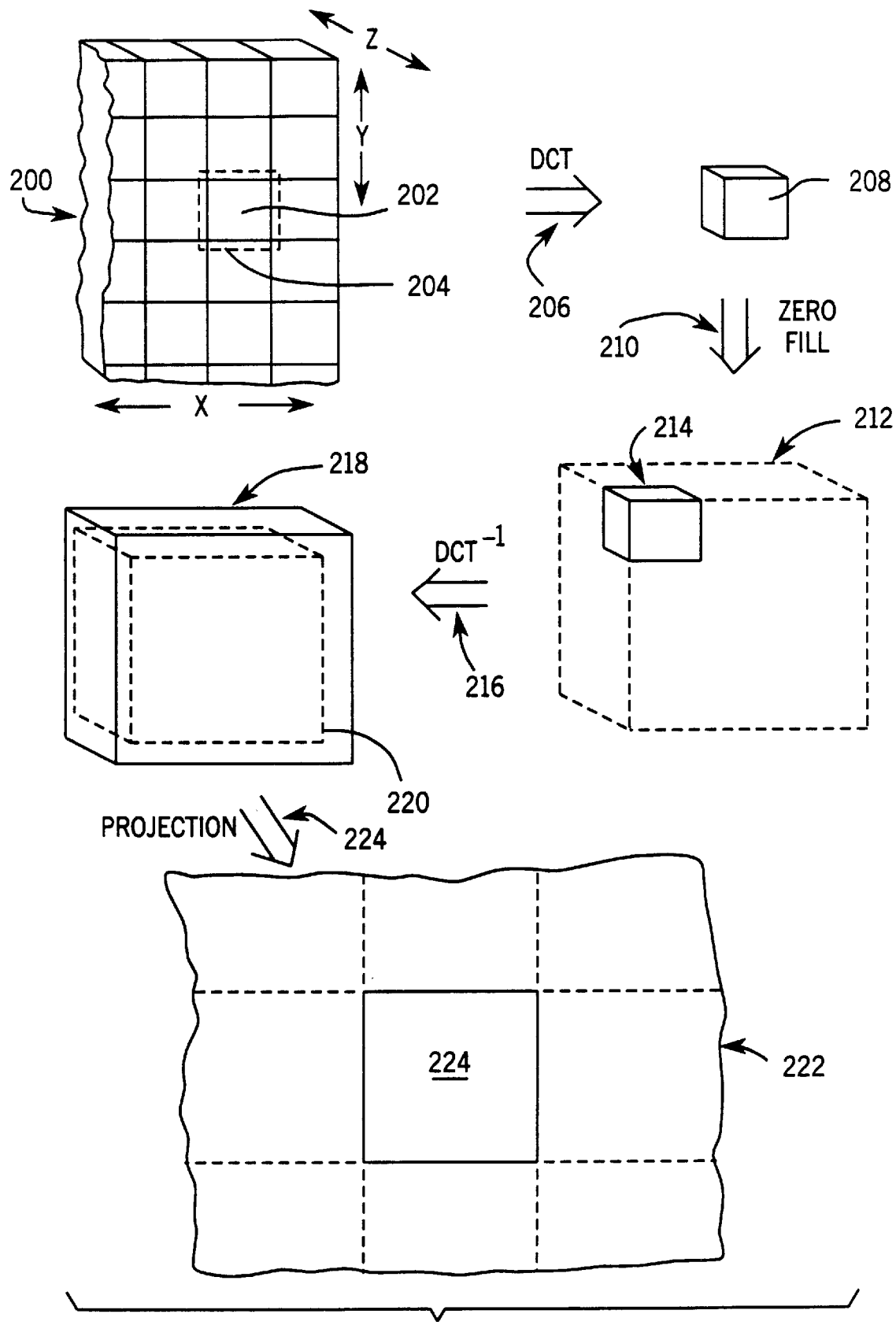
FIG. 3 is a schematic representation of the data structures produced by the program illustrated in FIG. 2.

Referring still to FIG. 3, the first step in the preferred embodiment of the invention is to divide the 3D MRA image array 200 into a plurality of subvolumes. One of these subvolumes is indicated at 202 and may, for example, include 30 by 30 by 30 voxels of data. This subvolume 200 is expanded in size by including a number of border voxels from the surrounding region as indicated by dashed line 204. Two additional voxels are included along each border resulting in a border subvolume 204 of 32 by 32 by 32 voxels.

As will be described in more detail below, the interpolation process is performed separately on each subvolume 202 and a complete, interpolated image is formed by combining the interpolated subvolumes at the end of the procedure. This strategy enables the interpolation to be performed faster due to the smaller data involved and it requires much less memory space than prior methods where the entire interpolated data set must be accommodated at any given time.

Referring still to FIG. 3, each bordered subvolume 204 is interpolated by first transforming it using a discrete cosine transformation ("DCT") indicated at 206. This results in a transformed subvolume data set 208 of the same size, and because the DCT does not produce complex numbers, the memory space required to store it does not double. This multi-dimensional DCT transform F of an image f is defined as follows:

$$F(n_1, n_2, n_3) = \sum_{k_1=0}^{N_1-1} \sum_{k_2=0}^{N_2-1} \sum_{k_3=0}^{N_3-1} f(k_1, k_2, k_3) \times \qquad (1)$$
$$\cos\left[\frac{(2k_1+1)n_1\pi}{2N_1}\right] \times \cos\left[\frac{(2k_2+1)n_2\pi}{2N_2}\right] \times \cos\left[\frac{(2k_3+1)n_3\pi}{2N_3}\right]$$

where: x denotes multiplication, and $N_1$, $N_2$ and $N_3$ denote number of voxels in each of the three dimensions respectively.

This DCT transformation may be carried out in software, or the available Fourier transformation hardware may be used as described at pages 152–53 in "Fundamentals of Digital Processing", by Anil K. Jain, published in 1989 by Prentice-Hall. Also, hardware used for image compression according to the industry standard "JPEG" may be used to perform the DCT transformation.

Each transformed subvolume 208 is then increased in size by zero-filling as indicated at 210. The resulting zero-filled subvolume 212 is comprised of the transformed subvolume data indicated by lines 214 extended by "zeros". In theory, the subvolume can be extended arbitrarily in each dimension by zero-filling to improve resolution. In practice, however, it has been found that the increased benefits are outweighed by the increased processing and increased memory required when the subvolume 208 is expanded beyond four times its size. An expansion ranging from two to four times is preferred.

Following the zero-filling step, the zero-filled subvolume 212 is inverse transformed as indicated at 216. This produces an interpolated subvolume 218 of equal size to the subvolume 212 (e.g. 4 times its original size in each dimension). The transformation 216 is an inverse DCT defined as follows:

$$f(k_1, k_2, k_3) = \frac{8}{N_1 N_2 N_3} \sum_{n_1=0}^{N_1-1}{}^{*} \sum_{n_2=0}^{N_2-1}{}^{*} \sum_{n_3=0}^{N_3-1}{}^{*} F(n_1, n_2, n_3) \times \qquad (2)$$
$$\cos\left[\frac{(2k_1+1)n_1\pi}{2N_1}\right] \times \cos\left[\frac{(2k_2+1)n_2\pi}{2N_2}\right] \times \cos\left[\frac{(2k_3+1)n_3\pi}{2N_3}\right]$$

where * indicates that the term for $n_1=0$, $n_2=0$, $n_3=0$ has a coefficient of "½" in front of it. As with the DCT transformation, the inverse DCT can be performed with software, FFT hardware or JPEG image compression hardware.

The final step in the process is to combine the interpolated subvolumes 218 to form a complete interpolated image. This can be accomplished in a number of ways, but first, the boundary data indicated by the region outside dashed lines 220 is stripped away. The resulting interpolated subvolumes 220 may be re-assembled into an interpolated 3D image, or in the alternative, each interpolated subvolume 220 may be projected onto a complete 2D image 222 as indicated at 224. The most commonly used projection technique is to project a ray from the corresponding subvolume 224 in the projection image 222 through the 3D interpolated subvolume 220 and select the data point therein which has the maximum value. The value selected for each ray is used to control the brightness of its corresponding pixel in the projection image subvolume 224. This method is known in the art as the "maximum intensity projection technique". Other projection techniques may also be used such as the "average intensity projection technique".

Figure 2:
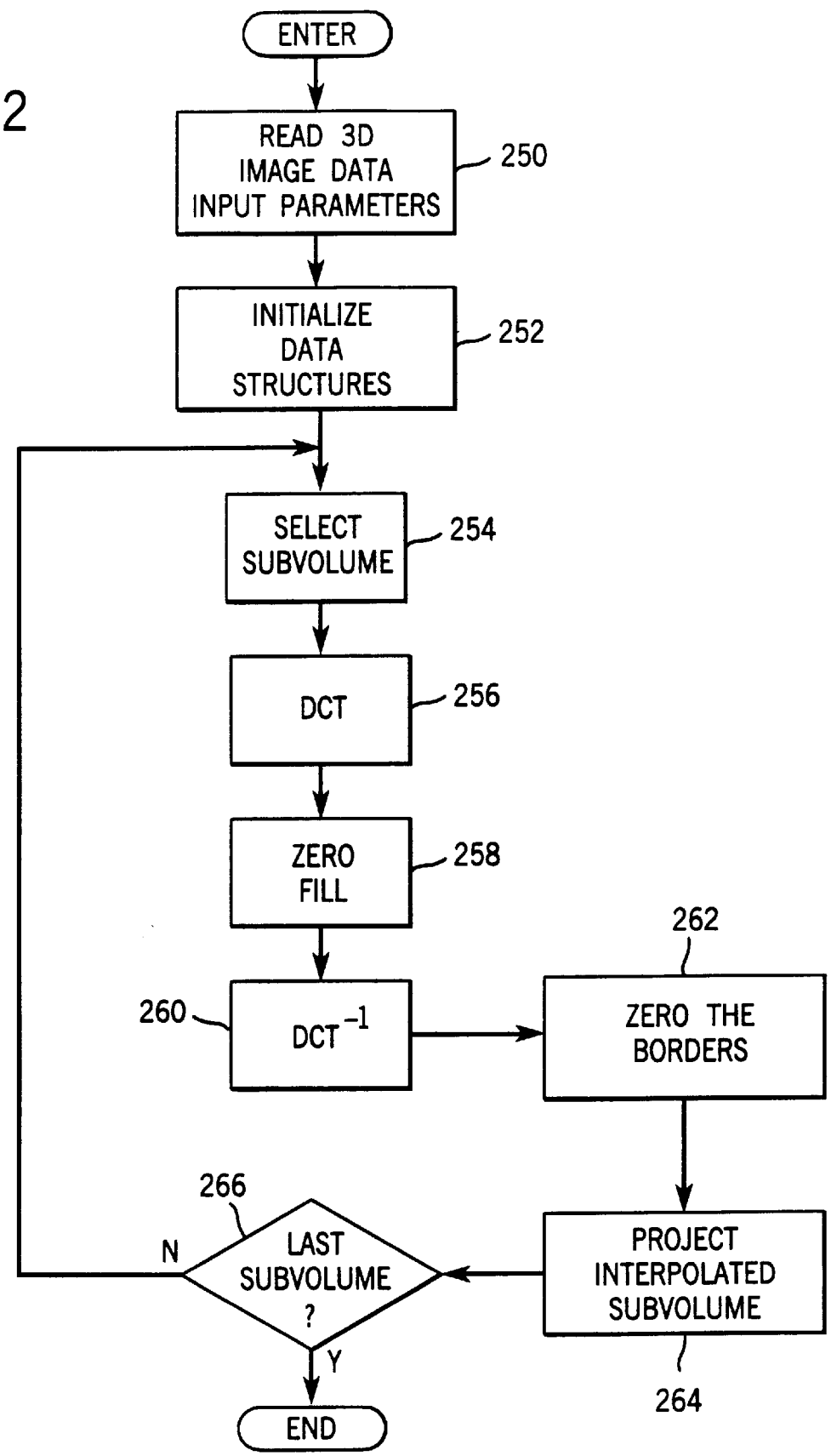
FIG. 2 is a flow chart to the program executed by the MRI system of FIG. 1 to practice the preferred embodiment of the invention.

Referring particularly to FIGS. 1 and 2, the present invention is implemented in part by a stored interpolation program executed in the computer system 107. The 3D MRA image data set 200 is acquired as described above and stored in memory 113. The program indicated by the flow chart in FIG. 2 is then executed to carry out the above-described method to produce an interpolated projection image for viewing on the display 104.

Referring particularly to FIG. 2, the interpolation program begins by reading the 3D MRA image data and inputting parameters that govern the interpolation method as indicated at process block 250. These include the coordinates of the volume of interest, the dimensions of the subvolumes, the interpolation factor, the size of the overlapping border dimension surrounding each subvolume and the desired projection angle(s). In the preferred embodiment, a default interpolation factor of 4 is used and the default overlapping region is two voxels along each subvolume dimension. As indicated at process block 252, the data structures needed to carry out the method are then initialized.

A loop is entered in which each subvolume is separately interpolated. More specifically, the next subvolume to be interpolated is selected at process block 254 and it is transformed at process 256 using the DCT transformation defined above in equation (1). The data points around the transformed subvolume are then filled with zeros at process 258 to provide the desired interpolation factor, and the zero-filled subvolume is inverse DCT transformed at 260. The border volume around the resulting interpolated subvolume are then set to zero at 262, and the 3D interpolated subvolume is projected at the desired projection angle as indicated at process block 264. The system loops back to process each identified subvolume in this manner, and when the last subvolume has been processed, the process ends as determined at decision block 266.

The present invention may also be used in applications where only a single subvolume is processed as described above. For example, using the present invention one can magnify a small subvolume preselected from a 3D image data set in near real-time. In this case the 3D image data set is projected to form a 2D projection image and the operator moves a cursor over the region to be magnified. A corresponding subvolume in the 3D image data set is thus identified and is magnified by the transformation, zero filling, inverse transformation method described above. The resulting magnified 3D subvolume is relatively small, it can be magnified quickly to produce a nearly real time update of the projection image.

I claim:

1. A method for increasing the resolution of an image formed by an image data set, the steps comprising:
   dividing the image data set into subvolumes;
   interpolating each subvolume by:
   a) transforming the subvolume;
   b) zero-filling to extend the transformed subvolume; and
   c) inverse transforming the zero-filled subvolume; and
   combining the interpolated subvolumes to form an interpolated image data set and producing an output image therefrom.

2. The method as recited in claim 1 in which the transformation is a discrete cosine transformation.

3. The method as recited in claim 1 in which the image data set is a 3D image data set and the output image is a 2D image produced by projecting the interpolated subvolumes.

4. The method as recited in claim 3 in which the 3D image data set is a 3D MRA image data set.

5. The method as recited in claim 3 in which each interpolated subvolume is separately projected onto the 2D image.

6. The method as recited in claim 3 in which each subvolume includes bordering data and corresponding interpolated bordering data in each interpolated subvolume is removed prior to producing said output image.

7. A method for magnifying a portion of the projection image produced from a 3D image data set, the steps comprising:
   a) selecting a region of the projection image;
   b) transforming a subvolume in the 3D image data set which corresponds to the selected region;
   c) zero-filling to extend the transformed subvolume;
   d) inverse transforming the zero-filled subvolume to form a magnified subvolume; and
   e) projecting the magnified subvolume to produce a magnified image of the selected region.

* * * * *